(12) United States Patent
Hirata et al.

(10) Patent No.: US 10,870,169 B2
(45) Date of Patent: Dec. 22, 2020

(54) LASER PROCESSING APPARATUS AND WAFER PRODUCING METHOD

(71) Applicant: DISCO CORPORATION, Tokyo (JP)

(72) Inventors: Kazuya Hirata, Tokyo (JP); Yasuyoshi Yubira, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 661 days.

(21) Appl. No.: 15/601,321

(22) Filed: May 22, 2017

(65) Prior Publication Data

US 2017/0341179 A1 Nov. 30, 2017

(30) Foreign Application Priority Data

May 30, 2016 (JP) ................................. 2016-107038

(51) Int. Cl.
| | | |
|---|---|---|
| *B23K 26/0622* | (2014.01) | |
| *H01S 3/10* | (2006.01) | |
| *B23K 26/03* | (2006.01) | |
| *B23K 26/00* | (2014.01) | |
| *B23K 26/53* | (2014.01) | |
| *B23K 26/08* | (2014.01) | |
| *C30B 29/40* | (2006.01) | |

(Continued)

(52) U.S. Cl.
CPC ...... *B23K 26/0622* (2015.10); *B23K 26/0006* (2013.01); *B23K 26/032* (2013.01); *B23K 26/035* (2015.10); *B23K 26/0823* (2013.01); *B23K 26/0853* (2013.01); *B23K 26/10* (2013.01); *B23K 26/364* (2015.10); *B23K 26/38* (2013.01); *B23K 26/40* (2013.01); *B23K 26/53* (2015.10); *C30B 29/406* (2013.01); *C30B 33/06* (2013.01); *H01L 21/02002* (2013.01); *H01S 3/1003* (2013.01); *B23K 2101/40* (2018.08); *B23K 2103/50* (2018.08); *H01S 3/0085* (2013.01)

(58) Field of Classification Search
CPC ........ B23K 26/06; B23K 26/40; B23K 26/03; B23K 26/10; B23K 26/36; B23K 26/38; H01L 21/02
USPC ............... 219/121.6–121.62, 121.67–121.72, 219/121.85, 121.73; 438/460–465
See application file for complete search history.

(56) References Cited

U.S. PATENT DOCUMENTS

| | | | | |
|---|---|---|---|---|
| 6,413,627 | B1 * | 7/2002 | Motoki | ................... C30B 25/02 117/952 |
| 2011/0315664 | A1 * | 12/2011 | Bruel | ................ H01L 21/76254 219/121.35 |

(Continued)

FOREIGN PATENT DOCUMENTS

JP 2011-084469 A 4/2011

*Primary Examiner* — Phuong T Nguyen
(74) *Attorney, Agent, or Firm* — Greer Burns & Crain Ltd.

(57) ABSTRACT

A laser processing apparatus for producing a GaN wafer from a GaN ingot includes a laser beam irradiating unit configured to apply a laser beam having a wavelength capable of passing through the GaN ingot held by a chuck table. The laser beam irradiating unit includes a laser oscillator configured to oscillate the laser beam. The laser oscillator includes a seeder configured to oscillate a high-frequency pulsed laser, a thinning-out unit configured to thin out high-frequency pulses oscillated by the seeder at a predetermined repetition frequency, and generate one burst pulse with a plurality of high-frequency pulses as subpulses, and an amplifier configured to amplify the generated burst pulse.

12 Claims, 5 Drawing Sheets

(51) Int. Cl.

| | |
|---|---|
| *C30B 33/06* | (2006.01) |
| *B23K 26/035* | (2014.01) |
| *B23K 26/364* | (2014.01) |
| *B23K 26/10* | (2006.01) |
| *B23K 26/38* | (2014.01) |
| *B23K 26/40* | (2014.01) |
| *H01L 21/02* | (2006.01) |
| *B23K 103/00* | (2006.01) |
| *B23K 101/40* | (2006.01) |
| *H01S 3/00* | (2006.01) |

(56) References Cited

U.S. PATENT DOCUMENTS

2015/0038313 A1* 2/2015 Hosseini ................ B23K 26/38
　　　　　　　　　　　　　　　　　　　501/32
2015/0151380 A1* 6/2015 Hosseini .............. B23K 26/009
　　　　　　　　　　　　　　　　　　　428/600

* cited by examiner

LASER PROCESSING APPARATUS AND WAFER PRODUCING METHOD

BACKGROUND OF THE INVENTION

Field of the Invention

The present invention relates to a laser processing apparatus for producing a GaN wafer from a GaN ingot, and a wafer producing method.

Description of the Related Art

A silicon (Si) wafer having a plurality of devices such as integrated circuits (ICs), large-scale integrations (LSIs), or the like demarcated by scheduled division lines and formed on the top surface of the Si wafer is divided into individual device chips by a dicing apparatus or a laser processing apparatus. The divided device chips are used in electric apparatuses such as mobile telephones, personal computers, or the like. Gallium nitride (GaN) has a band gap three times wider than that of Si. Therefore a GaN wafer is used when devices such as power devices, light emitting diodes (LEDs), or the like are formed. It is known that the GaN wafer is cut from a GaN ingot by using an inner circumferential edge whose edge thickness can be made smaller than an outer circumferential edge (see for example Japanese Patent Laid-Open No. 2011-84469).

SUMMARY OF THE INVENTION

However, even though the wafer is cut out from the GaN ingot by using the inner circumference edge, the thickness of the inner circumference edge is as much as approximately 0.3 mm, for example, as compared with the thickness (for example 150 µm) of the GaN wafer. Thus, 60% to 70% of the GaN ingot is cut away and discarded at a time of the cutting, which is uneconomical.

It is accordingly an object of the present invention to provide a laser processing apparatus that can produce a GaN wafer by cutting a GaN ingot efficiently and a method of producing the GaN wafer.

In accordance with an aspect of the present invention, there is provided a laser processing apparatus suitable for producing a GaN wafer from a GaN ingot, the laser processing apparatus including: a chuck table configured to hold the ingot; and laser beam irradiating means for applying a laser beam having a wavelength capable of passing through the GaN ingot held by the chuck table; the laser beam irradiating means including a laser oscillator configured to oscillate the laser beam, and a condenser configured to form a destruction layer in an interface at a depth corresponding to a thickness of the GaN wafer to be produced, by applying the laser beam oscillated by the laser oscillator while positioning a focusing point of the laser beam within the GaN ingot, the laser oscillator including a seeder configured to oscillate a high-frequency pulsed laser, a thinning-out unit configured to thin out high-frequency pulses oscillated by the seeder at a predetermined repetition frequency, and generate one burst pulse with a plurality of high-frequency pulses as sub-pulses, and an amplifier configured to amplify the generated burst pulse.

It is preferable that the thinning-out unit thin out the high-frequency pulses so as to generate the burst pulse in which, of two to ten as numbers of sub-pulses constituting one burst pulse, the number of sub-pulses that cause the destruction layer to extend longest at a position of the interface at which the focusing point is positioned is set. In particular, it is preferable that the number of sub-pulses that cause the destruction layer to extend longest be three.

In accordance with another aspect of the present invention, there is provided a GaN wafer producing method for producing a GaN wafer from a GaN ingot, the GaN wafer producing method including: a holding step of holding the GaN ingot by a chuck table; a laser beam irradiating step of forming a destruction layer in an interface at a depth corresponding to a thickness of the GaN wafer to be produced, by applying a laser beam having a wavelength capable of passing through the GaN ingot held by the chuck table while positioning a focusing point of the laser beam within the GaN ingot; and a wafer peeling step of peeling off the GaN wafer from the ingot; a laser oscillator configured to oscillate the laser beam including a seeder configured to oscillate a high-frequency pulsed laser, a thinning-out unit configured to thin out high-frequency pulses oscillated by the seeder at a predetermined repetition frequency, and generate one burst pulse with a plurality of high-frequency pulses as sub-pulses, and an amplifier configured to amplify the generated burst pulse.

It is preferable that the thinning-out unit thin out the high-frequency pulses so as generate one burst pulse in which, of two to ten as numbers of sub-pulses constituting one burst pulse, a number is selected which causes the destruction layer to extend longest at a position of the interface at which the focusing point is positioned. In particular, it is preferable that the number of sub-pulses that cause the destruction layer to extend longest be three.

Because the present invention is configured as described above, the energy of one burst pulse is applied so as to be distributed in the time width of one pulse. Therefore, GaN is separated into Ga and N stepwise, and the destruction layer is formed efficiently.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
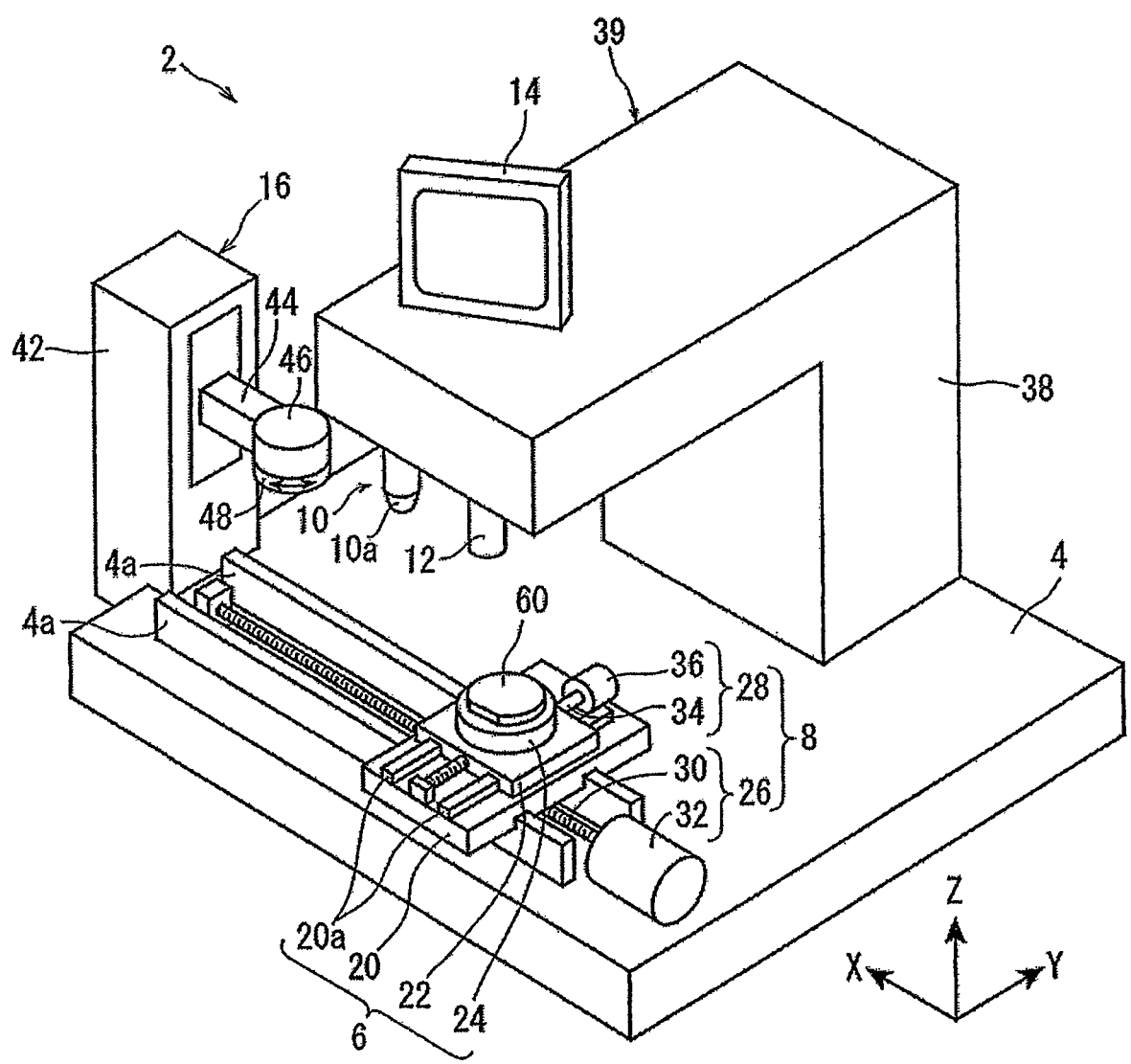
FIG. 1 is a perspective view of a laser processing apparatus including a laser oscillator according to an embodiment of the present invention.

A laser processing apparatus and a GaN wafer producing method according to an embodiment of the present invention will hereinafter be described in detail with reference to the drawings. A laser processing apparatus 2 depicted in FIG. 1 includes a base 4, holding means 6 for holding a workpiece, moving means 8 for moving the holding means 6, laser beam irradiating means 10, imaging means 12, display means 14, peeling means 16, and control means, which is not depicted in the figures.

The holding means 6 includes: a rectangular X-direction movable plate 20 mounted on the base 4 so as to be movable in an X-direction; a rectangular Y-direction movable plate 22 mounted on the X-direction movable plate 20 so as to be movable in a Y-direction; and a cylindrical chuck table 24 rotatably mounted on the top surface of the Y-direction movable plate 22. Incidentally, the X-direction is a direction indicated by an arrow X in FIG. 1. The Y-direction is a direction indicated by an arrow Y, and is a direction orthogonal to the X-direction. A plane defined by the X-direction and the Y-direction is practically horizontal.

The moving means 8 includes X-direction moving means 26, Y-direction moving means 28, and rotating means (not depicted). The X-direction moving means 26 has a ball screw 30 extending in the X-direction on the base 4 and a motor 32 coupled to one end portion of the ball screw 30. A nut portion (not depicted) of the ball screw 30 is fixed to the undersurface of the X-direction movable plate 20. The X-direction moving means 26 converts the rotary motion of the motor 32 into linear motion by the ball screw 30, and transmits the linear motion to the X-direction movable plate 20. The X-direction moving means 26 thereby advances or retreats the X-direction movable plate 20 in the X-direction along guide rails 4a on the base 4. The Y-direction moving means 28 has a ball screw 34 extending in the Y-direction on the X-direction movable plate 20 and a motor 36 coupled to one end portion of the ball screw 34. A nut portion (not depicted) of the ball screw 34 is fixed to the undersurface of the Y-direction movable plate 22. The Y-direction moving means 28 converts the rotary motion of the motor 36 into linear motion by the ball screw 34, and transmits the linear motion to the Y-direction movable plate 22. The Y-direction moving means 28 thereby advances or retreats the Y-direction movable plate 22 in the Y-direction along guide rails 20a on the X-direction movable plate 20. The rotating means has a motor (not depicted) included in the chuck table 24. The rotating means rotates the chuck table 24 with respect to the Y-direction movable plate 22.

The laser beam irradiating means 10 is disposed within a casing 39 that is supported by a supporting member 38 extending upward from the top surface of the base 4 and which extends substantially horizontally. The laser beam irradiating means 10 includes a condenser 10a disposed on the undersurface of an end of the casing 39.

The imaging means 12 is disposed on the undersurface of the end of the casing 39 at an interval from the condenser 10a in the X-direction. The imaging means 12 includes: a normal imaging element (CCD: charge-coupled device) that performs imaging by visible light; infrared irradiating means for irradiating a workpiece with infrared radiation; an optical system that captures the infrared radiation applied by the infrared irradiating means; and an imaging element (infrared CCD) that outputs an electric signal so as to correspond to the infrared radiation captured by the optical system (none of the above are depicted in the figures). The display means 14 for displaying an image imaged by the imaging means 12 is mounted on the top surface of the end of the casing 39.

The peeling means 16 includes: a frame body 42 extending upward from terminating end portions of the guide rails 4a on the base 4; and an arm 44 extending in the X-direction from a base end coupled to the frame body 42 so as to be movable in a Z-direction. The frame body 42 includes Z-direction moving means (not depicted) for advancing and retreating the arm 44 in the Z-direction. A motor 46 is attached to an end of the arm 44. A disk-shaped suction piece 48 is coupled to the undersurface of the motor so as to be rotatable about an axis extending in the Z-direction. The suction piece 48 has a plurality of suction holes formed in an undersurface (suction surface) thereof. The suction piece 48 is connected to suction means not depicted in the figures by a flow passage not depicted in the figures. In addition, the suction piece 48 includes ultrasonic vibration applying means (not depicted) for applying ultrasonic vibration to the undersurface.

The laser processing apparatus 2 includes control means (not depicted) constituted of a computer, which includes for example a central processing unit (CPU) that performs arithmetic processing according to a control program, a read-only memory (ROM) that stores the control program and the like, and a random access memory (RAM) that temporarily stores a result of operation and the like. The control means is electrically connected to the moving means 8, the laser beam irradiating means 10, the imaging means 12, the display means 14, and the peeling means 16 of the laser processing apparatus and the like to control the operation of these pieces of means.

Figure 2:
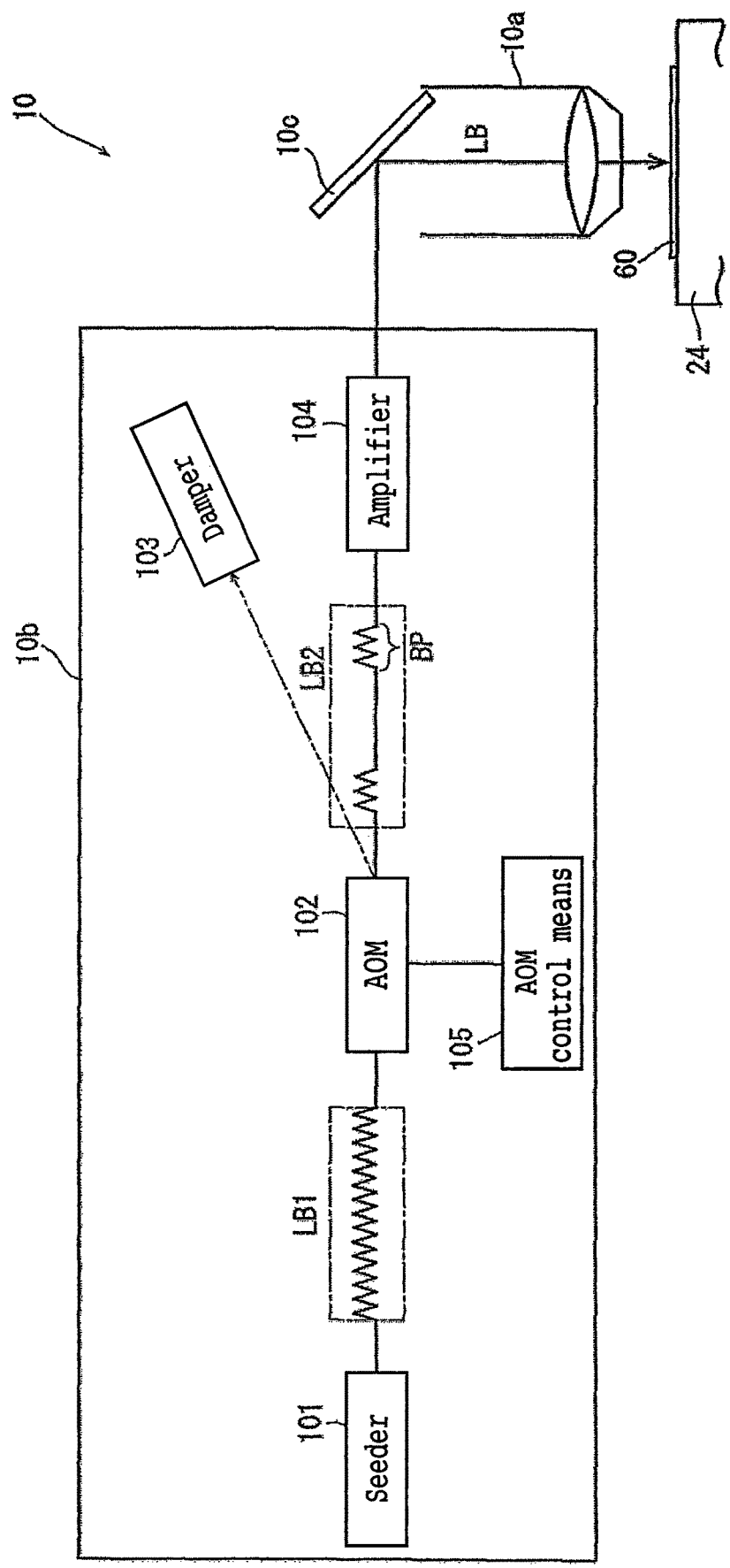
FIG. 2 is a block diagram depicting an outline of laser beam irradiating means.

The laser beam irradiating means 10 according to the embodiment of the present invention will be described in detail with reference to FIG. 2. The laser beam irradiating means 10 includes: the condenser 10a that irradiates a workpiece with a laser beam LB; a laser oscillator 10b that oscillates the laser beam LB; and a reflector 10c that guides the oscillated laser beam LB from the laser oscillator 10b to the condenser 10a. The laser oscillator 10b includes: a seeder 101 that oscillates a low-power high-frequency pulsed laser LB1 as seed light; an acoustooptic modulator (acousto-optic modulator, which will hereinafter be referred to as "AOM") 102 as a thinning-out unit that generates a plurality of high-frequency pulses (three pulses in the present embodiment, which pulses will hereinafter be referred to as "sub-pulses") as one burst pulse BP by thinning out the high-frequency pulsed laser LB1 oscillated by the seeder 101 at a predetermined repetition frequency; a damper 103 that absorbs the pulsed laser thinned out by the diffraction grating effect of the AOM 102; and an amplifier 104 that amplifies a pulsed laser LB2 transmitted by the AOM 102 and formed by burst pulses BP each constituted of a plurality of sub-pulses.

The AOM 102 for example includes an acoustooptic medium formed of tellurite-based glass. A piezoelectric element not depicted in the figures is bonded to the acoustooptic medium. The acoustooptic medium produces the action of a diffraction grating due to a photoelastic effect when the piezoelectric element transmits ultrasonic vibration to the acoustooptic medium. AOM control means 105 for generating an arbitrary ultrasonic vibration is connected to the piezoelectric element of the AOM 102. An arbitrary number of sub-pulses transmitted by the AOM 102 and constituting a burst pulse BP can be formed by controlling the AOM control means 105. The seeder 101, the AOM control means 105, and the amplifier 104 are controlled as appropriate by the control means not depicted in the figures which control means is included in the laser processing apparatus 2.

When the laser processing apparatus 2 in the present embodiment produces a GaN wafer from a GaN ingot, the laser beam irradiating means 10 applies a laser beam LB generated by amplifying a pulsed laser LB2 constituted of burst pulses BP each formed by a plurality of sub-pulses. It is desirable to set the pulse number of sub-pulses constituting one burst pulse BP appropriately in order to obtain a GaN wafer more efficiently by positioning the focusing point of the laser beam LB at a predetermined height position at which peeling is planned within the GaN ingot and irradiating a whole surface as an interface with the laser beam LB. The following description will be made of a method of determining the pulse number of sub-pulses constituting one burst pulse BP.

Figure 3A:
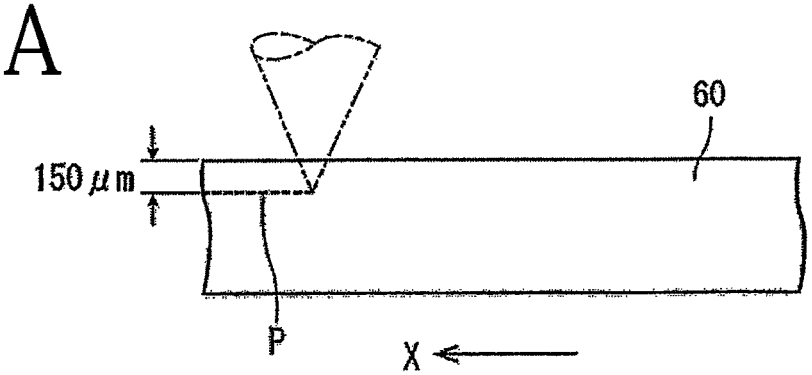
FIGS. 3A to 3C are diagrams of assistance in explaining a method of setting the pulse number of high-frequency pulses constituting a burst pulse in the laser beam irradiating means depicted in FIG. 2.

In order to produce a GaN wafer having a thickness of 150 μm from a GaN ingot 60 as a workpiece, as depicted in FIG. 3A, the laser processing apparatus 2 according to the present embodiment applies the laser beam while positioning the focusing point of the laser beam at a position of 150 μm from the top surface of the GaN ingot. Accordingly, one line of laser processing trace P is formed by performing laser processing at a similar position experimentally to determine an appropriate pulse number of sub-pulses constituting one burst pulse BP.

Figure 3B:
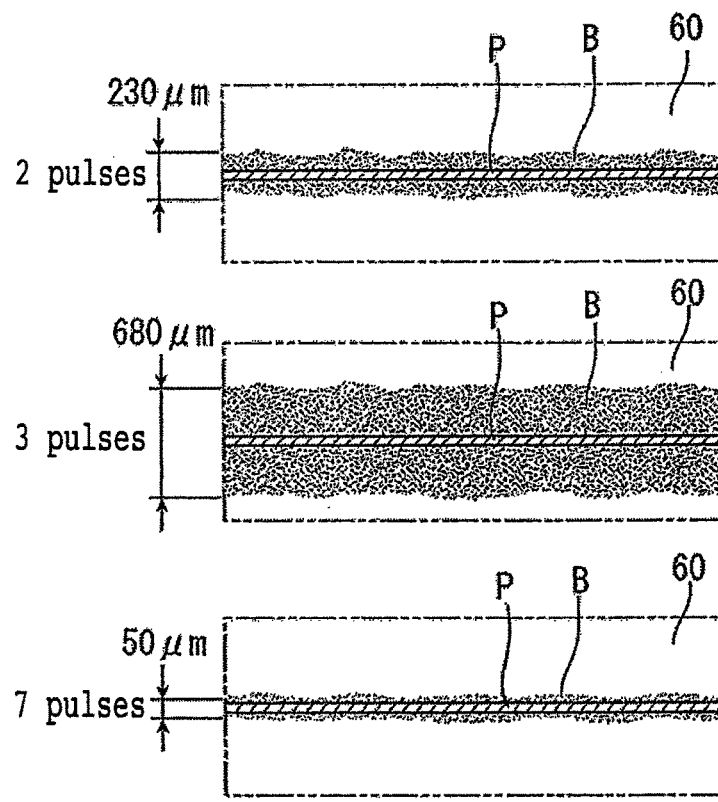
Figure 3C:
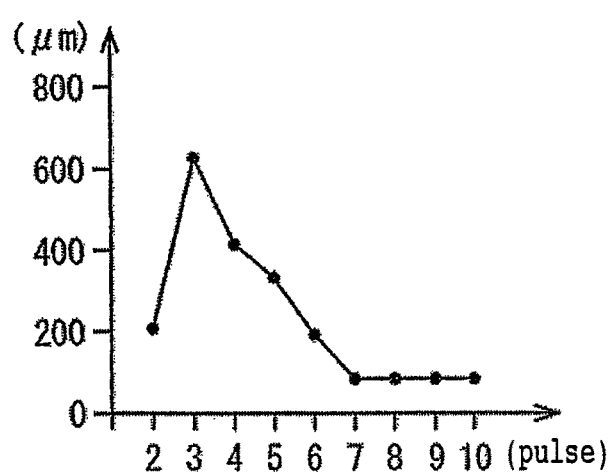

FIG. 3B is a partial enlarged view in a plan view of the GaN ingot 60 laser-processed experimentally as viewed from above. A destruction layer B in which the GaN ingot is separated into Ga and N is formed in a horizontal direction with the laser processing trace P formed by the laser processing as a center. Depicted from the top are a case where a burst pulse is formed when the number of sub-pulses constituting one burst pulse is two, a case where the number of similar sub-pulses is three, and a case where the number of similar sub-pulses is seven. As is clear from the figure, in the case of two sub-pulses, a destruction layer B of approximately 230 μm extends in the horizontal direction with the processing trace P as a center. Similarly, it is confirmed that a destruction layer B of 680 μm extends in the case of three sub-pulses, and that a destruction layer B of 50 μm extends in the case of seven sub-pulses. FIG. 3C depicts results of measuring an average length for which the destruction layer B extends in the horizontal direction after such experimental laser processing is performed with the number of sub-pulses set between two and ten.

It is understood from these results that an optimum value of the pulse number of sub-pulses constituting one burst pulse is three. That is, in the case of producing a GaN wafer from a GaN ingot, when one burst pulse is formed with the number of sub-pulses set at three and the laser beam is applied, laser beam intervals can be maximized when a peeling surface is formed at the interface within the GaN ingot, and thus the peeling surface for peeling off the GaN wafer can be formed efficiently with a smaller amount of laser processing. Incidentally, it is expected that the optimum number of sub-pulses may not be three depending on processing conditions at the time of performing the laser processing, the thickness of the GaN wafer to be produced, the quality of the GaN ingot to be processed, and the like. In that case, it suffices, as described above, to perform laser processing experimentally, determine the pulse number of sub-pulses which number causes the destruction layer to extend longest at the position of the interface at which the focusing point is positioned, and apply the pulse number of sub-pulses to actual laser processing.

The laser processing apparatus 2 configured on the basis of the present invention is generally configured as described above. A GaN wafer producing method performed by using the laser processing apparatus 2 according to the present embodiment will be described in detail in the following.

First, as depicted in FIG. 1, the undersurface of the GaN ingot 60 is fixed to the top surface of the chuck table 24 as holding means. The fixation can be performed by using for example an epoxy resin-based adhesive or the like (holding step). An alignment step is performed after the GaN ingot is fixed to the chuck table 24. In the alignment step, first, the moving means 8 moves the chuck table 24 to a position below the imaging means 12, and the imaging means 12 images the GaN ingot 60. Next, the outer circumference of the GaN ingot 60 and a notch (orientation flat) formed at the outer circumference are detected on the basis of an image of the GaN ingot 60 imaged by the imaging means 12, and the GaN ingot 60 and the condenser 10a are aligned with each other by moving and rotating the chuck table 24, so that the laser beam LB applied from the condenser 10a at a time of a start of processing is set at the central position of the GaN ingot 60. Next, focusing point position adjusting means moves the condenser 10a in the Z-axis direction to adjust the focusing point position of the pulsed laser to a position at a predetermined depth (150 μm) from the top surface of the GaN ingot.

Figure 4A:
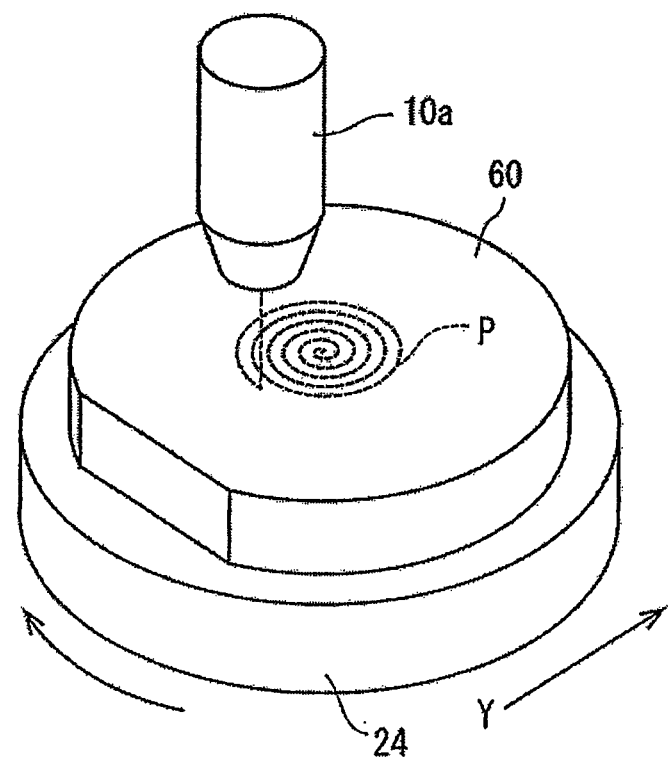
FIG. 4A and FIG. 4B are perspective views illustrating a laser beam irradiating step.

After the focusing point position is positioned at the central position of the GaN ingot, as depicted in FIG. 4A, the laser beam LB formed by burst pulses BP is applied from the condenser 10a toward the center of the GaN ingot, the chuck table 24 is rotated by the action of the motor (not depicted) included in the chuck table 24, and the Y-direction moving means 28 is actuated to move the chuck table 24 in the Y-direction at a predetermined speed. Consequently, a laser processing trace P formed by the application of the laser beam LB is formed in a spiral shape starting at the center of the GaN ingot (laser beam irradiating step).

Incidentally, the laser beam irradiating step in the present embodiment can be performed under the following processing conditions, for example.

Figure 4B:
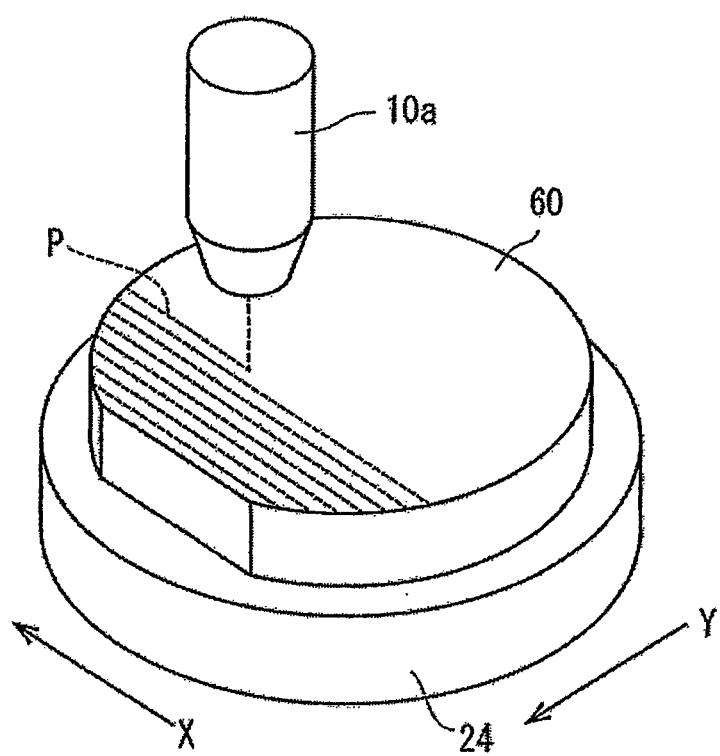

Wavelength of the laser beam LB: 1064 nm
Frequency of the high-frequency pulses LB1: 64 MHz
Pulse time width of the high-frequency pulses LB1: 315 fs
Pulse time intervals of the high-frequency pulses LB1: 15.6 ns
Repetition frequency of the laser beam LB: 100 kHz
Number of sub-pulses constituting the burst pulse BP: three (selectable from two to ten)
Time width of the burst pulse BP: 31.2 ns
Average power of the laser beam LB after amplification: 1 W
Energy per burst pulse: 1/100,000 (J)
Numerical aperture (NA): 0.8
Processing feed speed: 100 mm/second
Interface position: 150 μm (from the top surface of the ingot)
Index: 600 μm Incidentally, the processing feed speed during the application of the laser beam LB on the basis of the above-described processing conditions is desirably held constant to form the peeling surface with uniform quality. Hence, in the case where the application of the pulsed laser is started at the center of the GaN ingot, a rotational speed at which the chuck table is rotated is set so as to decrease gradually. In addition, in the embodiment depicted in FIG. 4A, the application of the laser beam LB is started at the center of the GaN ingot, and the laser processing trace P is formed outward gradually in a spiral shape by actuating the rotating means of the chuck table 24 and the Y-direction moving means 28. However, a method of irradiating the whole of the interface with the laser beam LB is not limited to this. For example, the application of the laser beam LB can be started on the outermost circumference side of the GaN ingot, and the center of the ingot can be set as an endpoint. Further, as depicted in FIG. 4B, when the laser processing trace P is formed on the whole of the interface by applying the laser beam LB, the whole of the interface may be irradiated with the laser beam LB by moving the chuck table 24 in the Y-direction stepwise while reciprocating the chuck table 24 linearly in the X-direction.

As described above, in the present embodiment, one burst pulse is formed by a plurality of high-frequency pulses (sub-pulses), the burst pulse is amplified, and then the laser beam is applied. Hence, the energy of one pulse (=one burst pulse) is applied to the position of the interface so as to be distributed in the time width of one pulse. Therefore, GaN is separated into Ga and N stepwise within the GaN ingot 60, and the peeling surface can be formed efficiently. In particular, in the present embodiment, the burst pulse is formed by selecting, as the pulse number of sub-pulses, a number (three) that causes the destruction layer to extend longest at the position of the interface at which the focusing point of the laser beam LB is positioned. Thus, when the interface is irradiated with the laser beam LB, laser beam irradiation positions adjacent to each other can be spaced apart most widely. Hence, laser processing can be completed in a short time, so that production efficiency is improved more.

Figure 5:
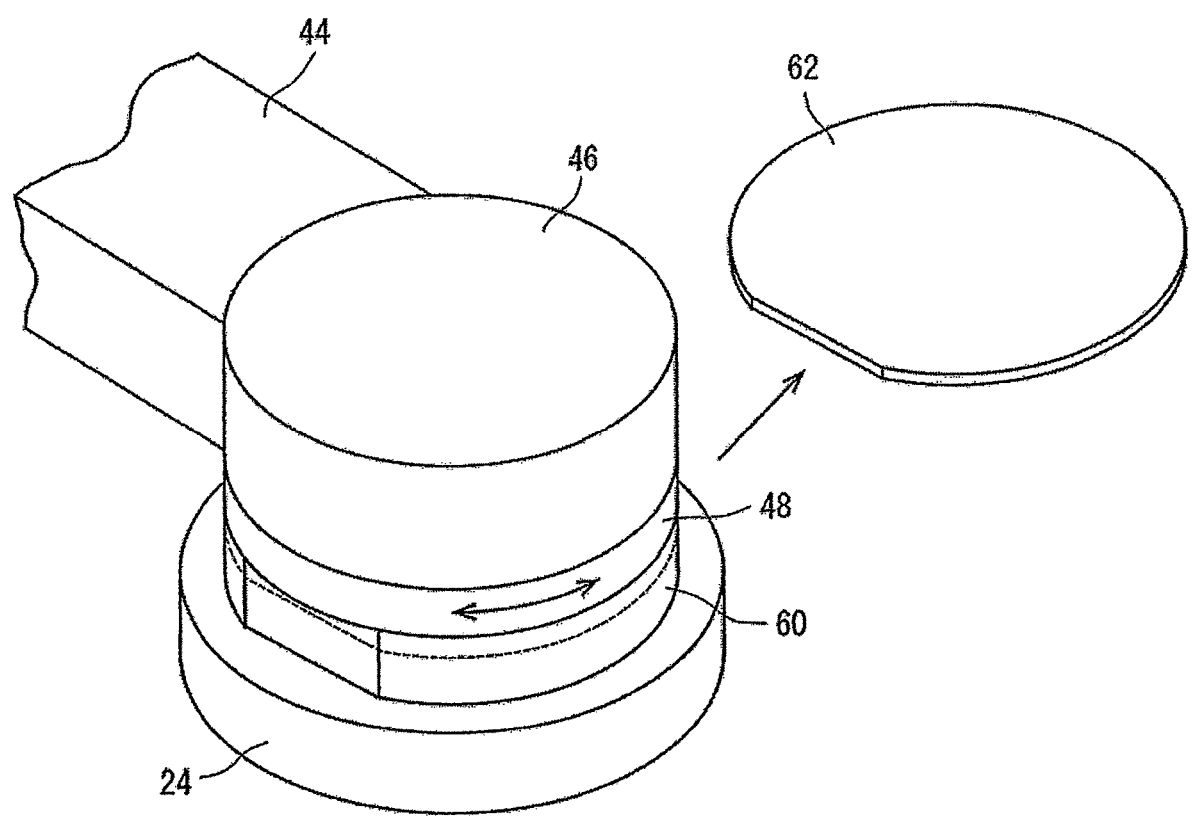
FIG. 5 is a perspective view illustrating a wafer peeling step.

After the laser beam irradiating step is ended, a wafer peeling step is performed. In the wafer peeling step, first, the moving means 8 moves the chuck table 24 to a position below the suction piece 48 of the peeling means 16. Next, the Z-direction moving means not depicted in the figures lowers the arm 44 to bring the undersurface of the suction piece 48 into close contact with the top surface of the GaN ingot 60, as depicted in FIG. 5. Next, the suction means is actuated to stick the undersurface of the suction piece 48 to the top surface of the GaN ingot 60. Next, the ultrasonic vibration applying means is actuated to apply ultrasonic vibration to the undersurface of the suction piece 48, and the motor 46 is actuated to rotate the suction piece 48. It is thereby possible to separate part of the GaN ingot 60 with the interface irradiated with the laser beam by the above-described laser beam irradiating step as the peeling surface, and thus possible to produce a wafer 62 having a desired thickness (150 μm) efficiently.

After the GaN wafer 62 is produced, the GaN ingot 60 is transferred to polishing means not depicted in the figures which polishing means is disposed on the base 4, the top surface of the GaN ingot 60 is polished, and the laser beam irradiating step and the wafer peeling step described above are sequentially repeated. Consequently, a total amount of material (GaN) discarded is decreased, and a large number of GaN wafers can be produced from the predetermined GaN ingot more efficiently. Incidentally, in the present embodiment, the step of peeling off the wafer is automatically performed by the peeling means 16 included in the laser processing apparatus 2. However, the means for peeling off the GaN wafer is not limited to this. For example, the peeling step can also be performed manually by a worker using an appliance including a suction surface and a jig including a gripping portion for gripping the appliance.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A laser processing apparatus suitable for producing a GaN wafer from a GaN ingot, the laser processing apparatus comprising:
   a chuck table configured to hold the ingot;
   laser beam irradiating means for applying a laser beam having a wavelength capable of passing through the GaN ingot held by the chuck table,
   the laser beam irradiating means including
      a laser oscillator configured to oscillate the laser beam, and
      a condenser configured to form a destruction layer in an interface at a depth corresponding to a thickness of the GaN wafer to be produced, by applying the laser beam oscillated by the laser oscillator while positioning a focusing point of the laser beam within the GaN ingot,
   the laser oscillator including:
      a seeder configured to oscillate a high-frequency pulsed laser,
      a thinning-out unit configured to thin out high-frequency pulses oscillated by the seeder at a predetermined repetition frequency, and generate one burst pulse with a plurality of high-frequency pulses as sub-pulses, and
      an amplifier configured to amplify the generated burst pulse; and
   peeling means including a suction piece with vibration applying means said suction piece configured to hold the ingot and said vibration applying means applies vibration to the ingot while said suction piece moves to separate the GaN wafer from the ingot.

2. The laser processing apparatus according to claim 1, wherein the thinning-out unit thins out the high-frequency pulses so as to generate the burst pulse in which, of two to ten as numbers of sub-pulses constituting one burst pulse, the number of sub-pulses that cause the destruction layer to extend longest at a position of the interface at which the focusing point is positioned is set.

3. The laser processing apparatus according to claim 2, wherein the number of sub-pulses that cause the destruction layer to extend longest is three.

4. The laser processing apparatus according to claim 1, wherein said laser beam irradiating means applies the laser beam to the ingot and rotates the chuck table to form a laser processing trace gradually inward in a spiral shape on the ingot.

5. The laser processing apparatus according to claim 1, wherein said laser beam irradiating means applies the laser beam to a center of the ingot and rotates the chuck table to form a laser processing trace gradually outward in a spiral shape on the ingot.

6. The laser processing apparatus according to claim 1, wherein said laser beam irradiating means applies the laser beam to the ingot while moving the chuck table in the X and Y directions.

7. A GaN wafer producing method for producing a GaN wafer from a GaN ingot, the GaN wafer producing method comprising:
   a holding step of holding the GaN ingot by a chuck table;
   a laser beam irradiating step of using a condenser configured for forming a destruction layer in an interface at a depth corresponding to a thickness of the GaN wafer to be produced, by applying a laser beam having a wavelength capable of passing through the GaN ingot held by the chuck table while positioning a focusing point of the laser beam within the GaN ingot; and
   a wafer peeling step of holding the GaN ingot using a suction piece and applying vibration to the ingot using vibration applying means while moving said suction piece to peel off the GaN wafer from the GaN ingot;

oscillating the laser beam using a laser oscillator including a seeder configured to oscillate a high-frequency pulsed laser, a thinning-out unit configured to thin out high-frequency pulses oscillated by the seeder at a predetermined repetition frequency, and generate one burst pulse with a plurality of high-frequency pulses as sub-pulses, and an amplifier configured to amplify the generated burst pulse.

8. The GaN wafer producing method according to claim 7, wherein the thinning-out unit thins out the high-frequency pulses so as to generate the burst pulse in which, of two to ten as numbers of sub-pulses constituting one burst pulse, the number of sub-pulses that cause the destruction layer to extend longest at a position of the interface at which the focusing point is positioned is set.

9. The GaN wafer producing method according to claim 8, wherein the number of sub-pulses that cause the destruction layer to extend longest is three.

10. The GaN wafer producing method according to claim 8, wherein said laser beam irradiating step includes applying the laser beam to a center of the ingot while rotating the chuck table to form a laser processing trace gradually outward in a spiral shape on the ingot.

11. The GaN wafer producing method according to claim 8, wherein said laser beam irradiating step includes applying the laser beam to the ingot while rotating the chuck table to form a laser processing trace gradually inward in a spiral shape on the ingot.

12. The GaN wafer producing method according to claim 8, wherein said laser beam irradiating step includes applying the laser beam to the ingot while moving the chuck table in the X and Y directions.

* * * * *